United States Patent
Embleton et al.

(10) Patent No.: US 11,503,736 B2
(45) Date of Patent: Nov. 15, 2022

(54) SYSTEM AND METHOD FOR SERVICE LIFE MANAGEMENT BY PASSIVELY REDUCING CORROSIVE INTERACTIONS

(71) Applicant: Dell Products L.P., Hopkinton, MA (US)

(72) Inventors: Steven Embleton, Austin, TX (US); Jon Taylor Fitch, Austin, TX (US); Sandor T. Farkas, Round Rock, TX (US); Joseph Danny King, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 200 days.

(21) Appl. No.: 16/938,491

(22) Filed: Jul. 24, 2020

(65) Prior Publication Data
US 2022/0030741 A1     Jan. 27, 2022

(51) Int. Cl.
  *H05K 7/20* (2006.01)
  *G06F 11/30* (2006.01)

(52) U.S. Cl.
  CPC ..... *H05K 7/20127* (2013.01); *G06F 11/3058* (2013.01); *H05K 7/20136* (2013.01)

(58) Field of Classification Search
  CPC .................................................. G06F 1/182
  See application file for complete search history.

(56) References Cited

U.S. PATENT DOCUMENTS

| | | | |
|---|---|---|---|
| 4,337,892 A | 7/1982 | Diermayer et al. | |
| 4,441,653 A | 4/1984 | Grudich | |
| 5,253,674 A | 10/1993 | Argyle et al. | |
| 6,229,701 B1 | 5/2001 | Kung et al. | |
| 6,997,043 B2 | 2/2006 | Swanson et al. | |
| 7,031,154 B2 | 4/2006 | Bash et al. | |
| 7,597,616 B2 | 10/2009 | Browne et al. | |
| 8,408,981 B2 | 4/2013 | Su et al. | |
| 8,723,534 B2 | 5/2014 | Chey et al. | |
| 9,261,926 B2 | 2/2016 | Larsen et al. | |
| 9,807,911 B1 * | 10/2017 | Bryan | G06F 1/20 |
| 10,631,432 B2 | 4/2020 | Gopalakrishna et al. | |
| 10,757,831 B2 | 8/2020 | Adrian | |
| 10,823,439 B2 | 11/2020 | Shelnutt et al. | |

(Continued)

FOREIGN PATENT DOCUMENTS

CN   205690636 U   11/2016

OTHER PUBLICATIONS

"Boundary Layer"; Glenn Research Center, NASA; May 5, 2015 (https://www.grc.nasa.gov/WWW/K-12/airplane/boundlay.html).

(Continued)

*Primary Examiner* — Santosh R Poudel
(74) *Attorney, Agent, or Firm* — Chamberlain, Hrdlicka, White, Williams & Aughtry

(57) ABSTRACT

An information handling system includes a computing component that is sensitive to corrosion; and a chassis in which the computing component is disposed. The chassis receives an airflow used to thermally manage the computing component, and expels the airflow after thermally managing the computing component. The information handling system also includes an environmental control component that reduces a condensation formation propensity of a portion of the airflow that traverses the chassis proximate to the computing component.

17 Claims, 7 Drawing Sheets

(56) References Cited

U.S. PATENT DOCUMENTS

| | | |
|---|---|---|
| 2005/0121945 A1 | 6/2005 | Browne et al. |
| 2006/0039112 A1 | 2/2006 | Minamitani et al. |
| 2008/0204996 A1* | 8/2008 | Sun .................. H05K 7/20727 361/694 |
| 2011/0081851 A1 | 4/2011 | Franz et al. |
| 2011/0235272 A1 | 9/2011 | Bash et al. |
| 2013/0070409 A1 | 3/2013 | Hoss et al. |
| 2013/0242504 A1 | 9/2013 | Cartes |
| 2014/0073234 A1 | 3/2014 | Elison et al. |
| 2014/0355203 A1 | 12/2014 | Kondo |
| 2015/0156917 A1 | 6/2015 | Ogawa et al. |
| 2015/0271957 A1 | 9/2015 | Pal |
| 2016/0034008 A1 | 2/2016 | Smith et al. |
| 2016/0286691 A1* | 9/2016 | Sprague ............ H05K 7/20209 |
| 2017/0089607 A1 | 3/2017 | Vichare et al. |
| 2017/0100617 A1* | 4/2017 | Kochelek ............. A62C 37/50 |
| 2018/0038785 A1* | 2/2018 | Goergen ................ G01N 17/04 |
| 2018/0070473 A1 | 3/2018 | Zhang et al. |
| 2018/0149579 A1* | 5/2018 | Brookhart ................ B64F 5/60 |
| 2018/0163985 A1 | 6/2018 | Shelnutt et al. |
| 2019/0310696 A1 | 10/2019 | Campbell et al. |
| 2019/0343022 A1 | 11/2019 | Tseng et al. |
| 2019/0371367 A1 | 12/2019 | Asmussen et al. |
| 2021/0100137 A1 | 4/2021 | Harrington |
| 2022/0026968 A1 | 1/2022 | Embleton et al. |
| 2022/0027228 A1 | 1/2022 | Embleton et al. |
| 2022/0030741 A1 | 1/2022 | Embleton et al. |

OTHER PUBLICATIONS

Theodore L. Bergman, Adrienne S. Lavine, Frank P. Incropera, David P. DeWitt; "Fundamentals of Heat and Mass Transfer, 7th Edition"; John Wiley & Sons, Inc.; pp. 477-482; 2011.

* cited by examiner

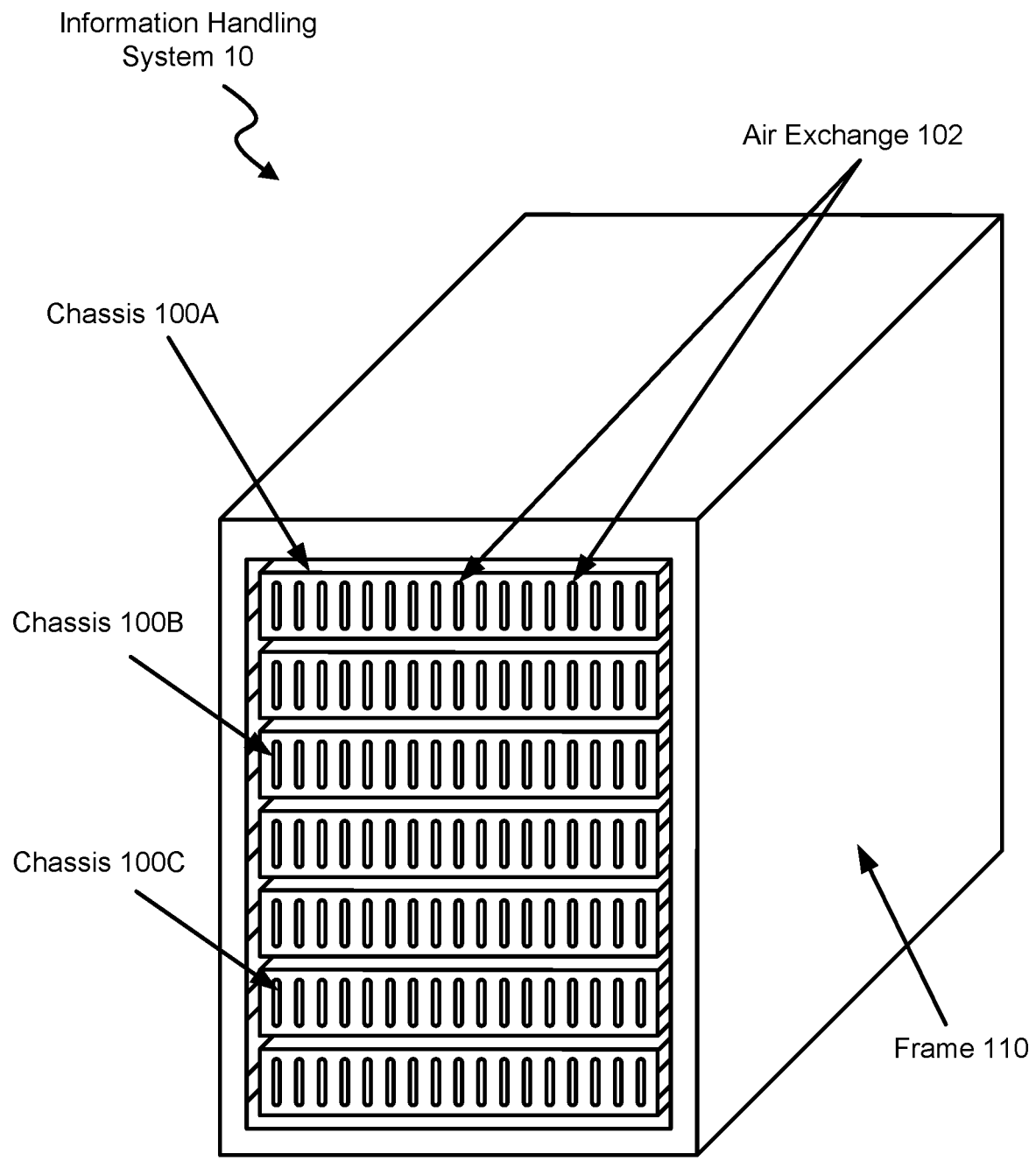
FIG. 1.1

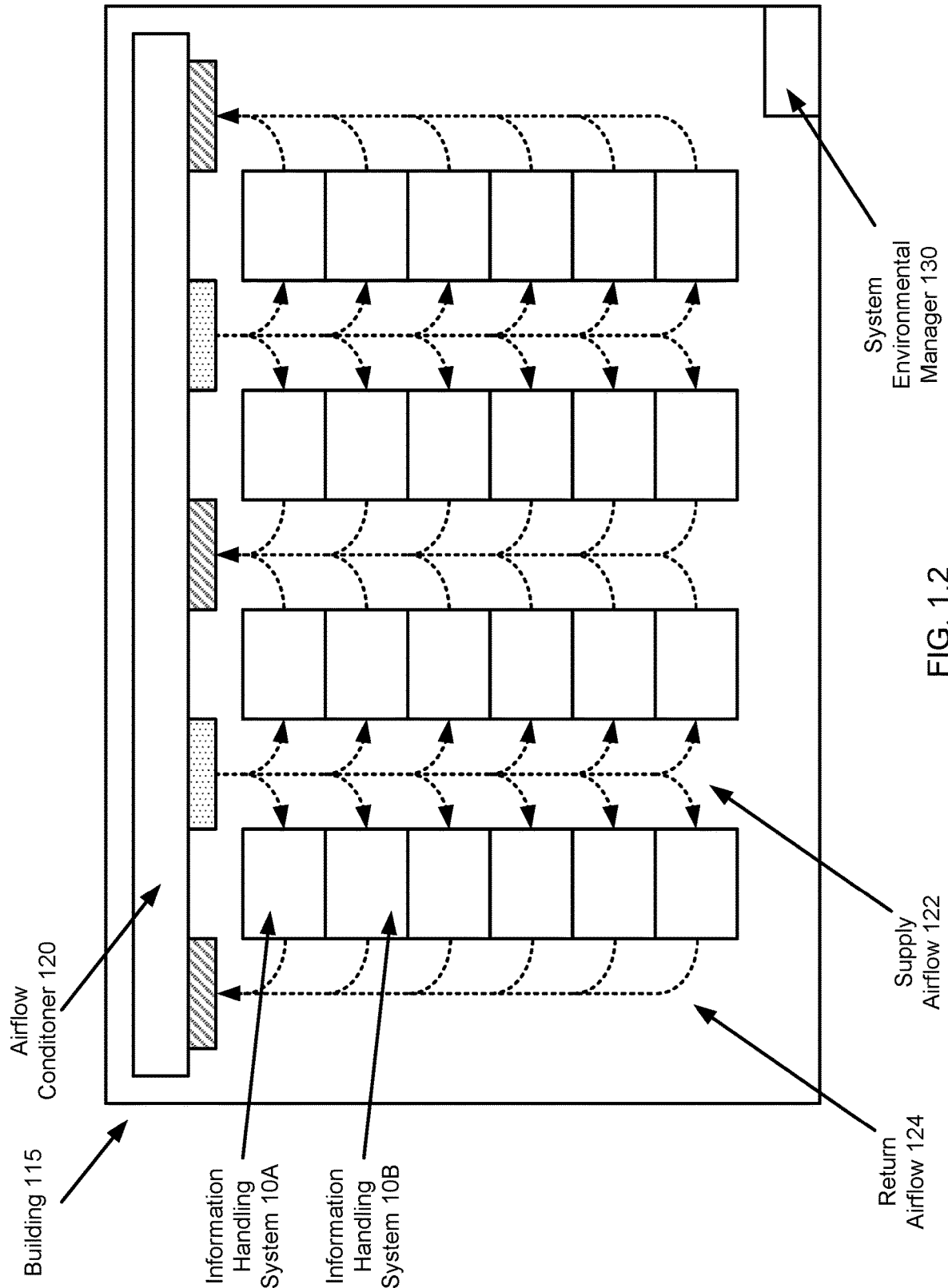
FIG. 1.2

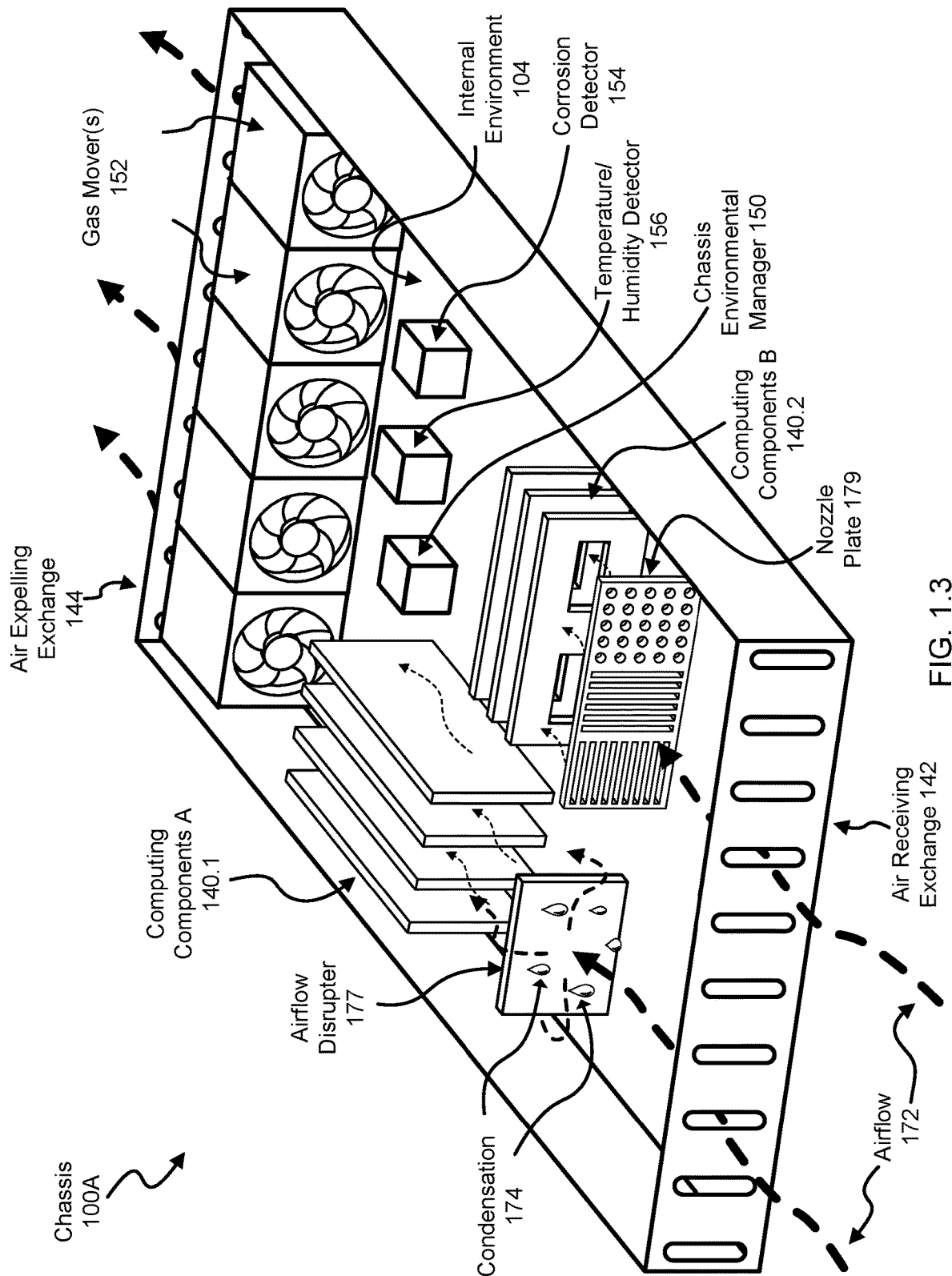
FIG. 1.3

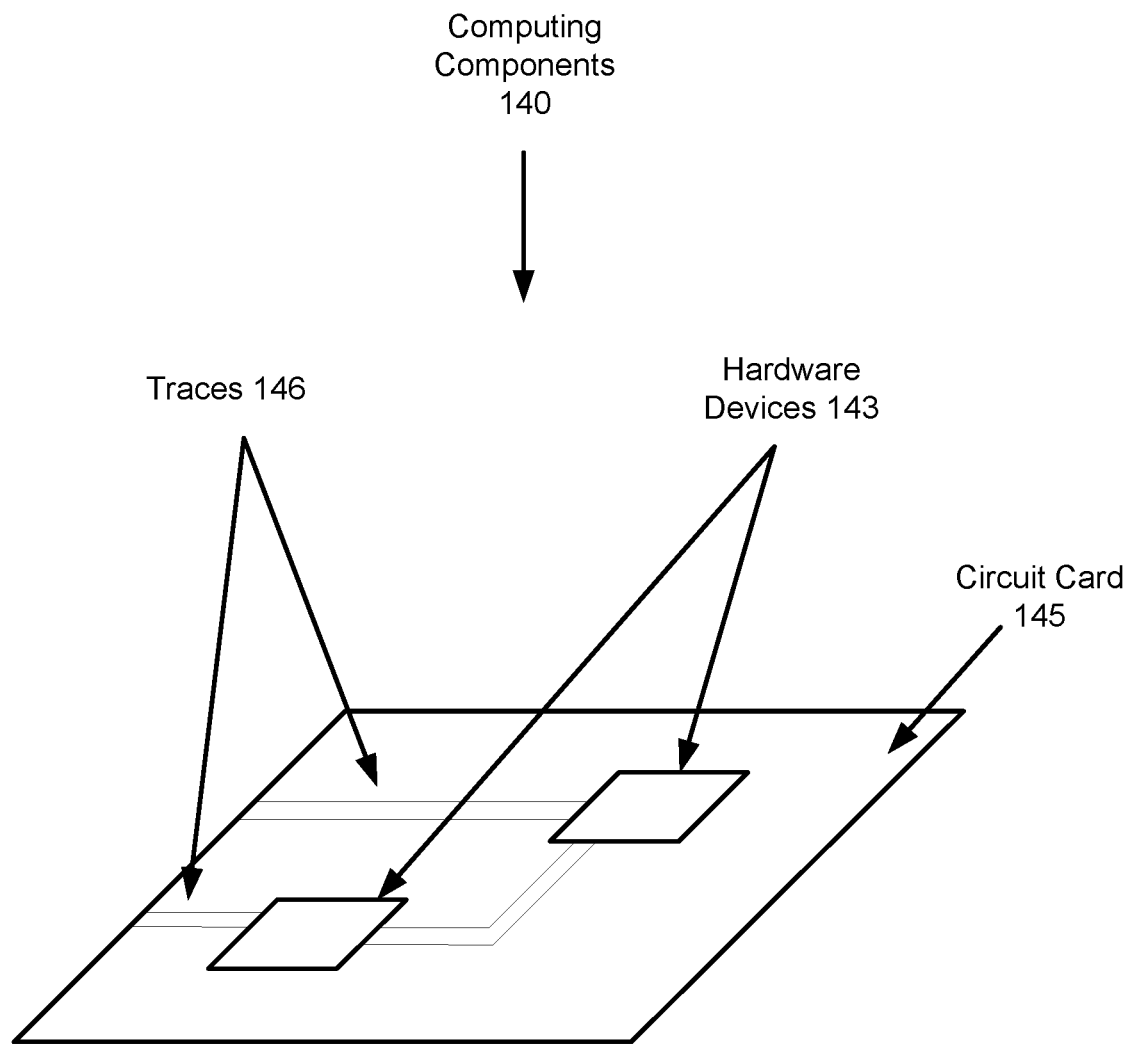
FIG. 1.4

SYSTEM AND METHOD FOR SERVICE LIFE MANAGEMENT BY PASSIVELY REDUCING CORROSIVE INTERACTIONS

BACKGROUND

As the value and use of information continues to increase, individuals and businesses seek additional ways to process and store information. One option available to users is information handling systems. An information handling system (IHS) generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Use cases for information handling systems are causing progressively larger number of information handling systems to be disposed near each other. For example, rack mount systems utilize a rack structure to stack in an information handling system. Due to the changing uses of information handling systems, chassis information handling systems may modular. That is, an information handling system may be composed of multiple enclosures that may be attached to each other to form the chassis of the information handling systems. When the multiple enclosures are attached, components of the information handling system disposed in each of the enclosures may become operably connected to each other.

SUMMARY

In one aspect, an information handling system in accordance with one or more embodiments of the invention includes a computing component that is sensitive to corrosion; and a chassis in which the computing component is disposed. The chassis receives an airflow used to thermally manage the computing component, and expels the airflow after thermally managing the computing component. The information handling system also includes an environmental control component that reduces a condensation formation propensity of a portion of the airflow that traverses the chassis proximate to the computing component.

In one aspect, a method for environmentally managing a an information handling system in accordance with one or more embodiments of the invention includes thermally managing a computing component that is sensitive to corrosion using an airflow received by a chassis that houses the computing component; and, while thermally managing the computing component, reducing a condensation formation propensity of a portion of the airflow that traverses the chassis proximate to the computing component using an environmental control component. The environmental control component is a passive device.

In one aspect, a non-transitory computer readable medium in accordance with one or more embodiments of the invention includes computer readable program code, which when executed by a computer processor enables the computer processor to perform a method for environmentally managing an information handling system. The method includes thermally managing a computing component that is sensitive to corrosion using an airflow received by a chassis that houses the computing component; and, while thermally managing the computing component, reducing a condensation formation propensity of a portion of the airflow that traverses the chassis proximate to the computing component using an environmental control component. The environmental control component is a passive device.

Other aspects of the invention will be apparent from the following description and the appended claims.

BRIEF DESCRIPTION OF DRAWINGS

FIG. 1.1 shows a diagram of an information handling system in accordance with one or more embodiments of the invention.

FIG. 1.2 shows a diagram of a building that includes information handling systems in accordance with one or more embodiments of the invention.

FIG. 1.3 shows a diagram of a chassis of an information handling systems in accordance with one or more embodiments of the invention.

FIG. 1.4 shows a diagram of computing components in accordance with one or more embodiments of the invention.

DETAILED DESCRIPTION

Figure 2:
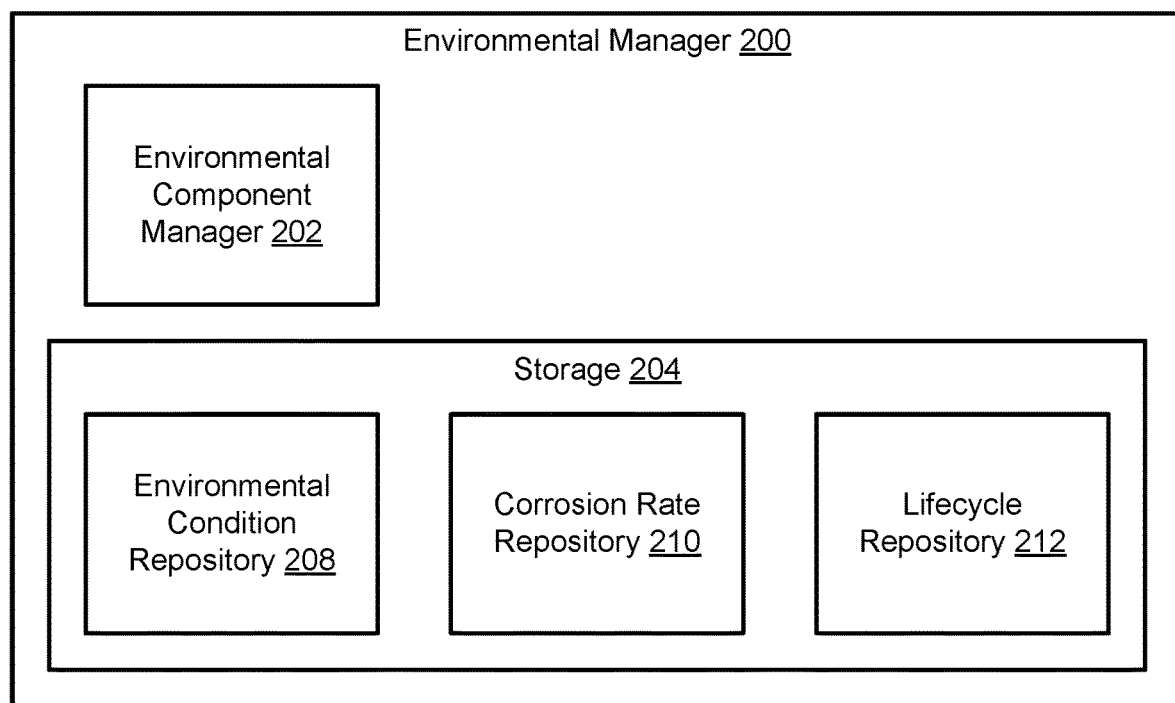
FIG. 2 shows a diagram of an environmental manager of an information handling system in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for managing components of an information handling system. An information handling system may be a system that provides computer implemented services. These services may include, for example, database services, electronic communication services, data storage services, etc.

To provide these services, the information handling system may include one or more computing devices. The computing devices may include any number of computing components that facilitate providing of the services of the information handling system. The computing components may include, for example, processors, memory modules, circuit cards that interconnect these components, etc.

During operation, these components may generate heat and require gas flows to maintain the temperatures of these components within nominal ranges. However, these gases may cause corrosion. The corrosion may damage the corroded components. The damage may cause the components to fail and/or cause information handling system utilizing the components to fail.

Embodiments of the invention may provide methods and systems that manage corrosion. To manage corrosion, a system may reduce the condensation formation propensity of gases used for thermal management of the components prior to thermal management of the components. To reduce the condensation formation propensity, the system may include an environmental management component. The environmental management component may modify the direction of travel, rate of travel, turbulence, and/or other characteristics of an airflow prior to it traversing proximate to a corrosion sensitive component. By doing so, condensation may be removed from the airflow, the airflow may be less likely to diffuse water vapor towards a corrosion sensitive component, and/or the airflow may be modified to otherwise reduce its condensation formation propensity.

As used herein, the condensation formation propensity of an airflow is the likelihood that water vapor in an airflow will condense on a component. Embodiments of the invention may reduce or otherwise modify the condensation formation propensity of an airflow by modifying it prior to it interacting with a corrosion sensitive component.

In one or more embodiments of the invention, the environmental management components used to modify the condensation formation propensity of airflows are implemented as passive components. The environmental management components may be disposed upstream of corrosion sensitive components in the airflows used to thermally manage the corrosion sensitive components.

By doing so, a system in accordance with embodiments of the invention may be less likely to prematurely fail or otherwise enter an undesirable corrosion state due to corrosion, be able to accept a wider range of gas compositions that may be more likely to cause corrosion without negatively impacting the system, and/or may be less costly to operate by reducing the necessary level of conditioning of gases taken into chassis of information handling systems for thermal management purposes.

FIG. 1.1 shows an information handling system (10) in accordance with one or more embodiments of the invention. The system may include a frame (110) and any number of chassis (e.g., 100A, 100B, 100C).

The frame (110) may be a mechanical structure that enables chassis to be positioned with respect to one another. For example, the frame (110) may include a rack mount enclosure that enables chassis to be disposed within it. The frame (110) may be implemented as other types of structures adapted to house, position, orient, and/or otherwise physically, mechanically, electrically, and/or thermally manage chassis. By managing the chassis, the frame (110) may enable multiple chassis to be densely packed in space without negatively impacting the operation of the information handling system (10).

A chassis (e.g., 100A) may be a mechanical structure for housing components of an information handling system. For example, a chassis may be implemented as a rack mountable enclosure for housing components of an information handling system. The chassis may be adapted to be disposed within the frame (110) and/or utilize services provided by the frame (110) and/or other devices. For example, the chassis (e.g., 100A-100C) may have form factors compatible with those implemented by the frame (110).

Any number of components may be disposed in each of the respective chassis (e.g., 100A, 100B, 100C). These components may be portions of computing devices that provide computer implemented services, discussed in greater detail below.

When the components provide computer implemented services, the components may generate heat. For example, the components may utilize electrical energy to perform computations and generate heat as a byproduct of performing the computations. If left unchecked, a buildup of heat within a chassis may cause temperatures of the components disposed within the chassis to exceed preferred ranges.

The preferred ranges may include a nominal range in which the components respectively operate: (i) without detriment and/or (ii) are likely to be able to continue to operate through a predetermined service life of a component. Consequently, it may be desirable to maintain the temperatures of the respective components within the preferred range (e.g., a nominal range).

When a component operates outside of the preferred range, the service life of the component may be reduced, the component may not be able to perform optimally (e.g., reduced ability to provide computations, higher likelihood of error introduced into computations, etc.), and/or the component may be more likely to unexpectedly fail. The component may be subject to other undesirable behavior when operating outside of the preferred range without departing from the invention.

To operate components within the preferred range of temperature, the chassis may include air exchanges (e.g., 102). An air exchange may be one or more openings in an exterior of a chassis that enables the chassis to exchange gases with an ambient environment. For example, a chassis may utilize air exchanges to (i) vent hot gases and (ii) intake cool gases. By doing so, the temperature of the gases within the chassis may be reduced. Consequently, the temperatures of components within the chassis may be reduced by utilizing the cooler gases taken into the chassis via an air exchange.

However, utilizing gases to cool components within a chassis may be problematic as the gases may not be benign. For example, the gases may be: (i) chemically reactive, (ii) include humidity, and/or (iii) otherwise interact with portions of the chassis and/or components disposed within the chassis in an undesirable manner. The reaction between the gases used to cool the components, portions of the chassis, and the components themselves (or other components proximate to the to-be-cooled components) may negatively impact the components disposed within the chassis and/or with the chassis itself.

For example, if the gases include a chemically reactive component (e.g., chlorine species), the gases may react (i.e., chemically react) with portions of the chassis and/or components disposed within the chassis. These reactions may: (i) generate corrosion on the portions of the chassis and/or (ii) generate corrosion on the components disposed within the chasses. This corrosion may (a) negatively impact the appearance of the chassis, (b) cause corrosion from the chassis to circulate within the chassis thereby potentially impacting the operation of components within the chassis, and/or (c) damage portions of the components disposed within the chassis directly resulting in a decreased service life of the components.

In another example, if the gases include humidity, the humidity may (under certain conditions) condense resulting in water (even at low levels) being disposed on the surfaces of the chassis and/or components. For example, when gases are taken into the chassis via an air exchange (102), water vapor may condense onto the surface of the air exchanger.

When water is disposed on the surface of the chassis and/or components (even at very small levels), the water may chemically react forming corrosion, albeit at a much reduced rate when compared to chemically reactive species. The aforementioned reactions with the condensed water may damage the chassis, generate corrosion products that may circulate throughout the chassis, and/or damage the components or otherwise cause them to operate in an undesirable manner. Compounding corrosion due to condensed humidity and chemically reactive species may be particularly problematic because a condensed layer of water on the components or chassis may preferentially absorb chemically reactive species which may amplify the corrosive impact of the chemically reactive species.

The potential reactions, discussed above, may cause numerous negative impacts. First, the reactions may impact the appearance of the chassis. The reaction products may have an unsightly appearance that makes the chassis look impaired to a viewer. Second, the reaction products may not be fixedly attached thereby resulting in reaction products circulating throughout the interior of the chassis. These products may be deposited in unpredictable manners throughout the chassis. When deposited, the reaction products may cause, for example, short circuits, changes in impedance of circuits, or otherwise impact the ability of other components to perform their functionalities.

Third, the reactions may impact the physical size of various components disposed within the chassis. For example, when metals chemically react, the products formed by the reactions may occupy significantly larger volumes than the unreacted metals (e.g., metal oxides vs elemental metals). The change in volumes of the reacted metals may negatively impact the electrical functionality of the components by, for example, forming open circuits by physically disconnecting various portions of the components from each other and/or other devices.

The potential reactions may cause other negative impacts beyond those discussed herein. The negative impacts may cause a device to fail prior to meeting its service life. A service life may be a desired duration of operation of a component, device, or system. For example, a chassis may have a service life of 2 years, 5 years, 10 years, etc. depending on the design of the chassis and/or goal of an IHS of which the chassis is a member.

To address the above and/or other potential issues, embodiments of the invention may provide methods, devices, and systems that mitigate corrosion. To mitigate corrosion, environmental control components may be used. Environmental control components (e.g., gas mover(s), airflow disrupter(s), nozzle plate(s)) to reduce corrosion and/or reduce the amount of power consumed for environmental management purposes. An environmental control component may be a structure that dehumidifies (i.e., dehumidifies) gases that makeup the airflow within the chassis, redirects airflow, changes the temperature, changes the volumetric flow rate of the airflow, etc. These changes may reduce the condensation formation propensity of the airflow downstream from the environmental control components.

To further clarify the environments in which corrosion may arise, a diagram of an environment in which chassis of IHSs may reside is illustrated in FIG. 1.2 and a diagram of a chassis is provided in FIG. 1.3.

FIG. 1.2 shows a top view diagram of a building (115) in which chassis of IHSs may reside in accordance with one or more embodiments of the invention. The building (115) may house a data center (e.g., an aggregation of information handling systems) that includes any number of information handling systems (e.g., 10A, 10B). The information handling systems may include chassis which may need to take in and exhaust gases for temperature regulation purposes due to heat generation by components disposed in the chassis.

To facilitate gas management within the building (115), the information handling systems may be organized into rows (or other groupings of information handling systems). In FIG. 1.2, the rows of information handling systems extend from top to bottom along the page. To enable gases to be provided to the information handling systems (e.g., for temperature regulation purposes), an airflow conditioner (120) may be disposed within the building. The airflow conditioner (120) may provide supply airflow (122) and take in a return airflow (124). These airflows are illustrated as arrows having dashed tails.

The supply airflow (122) may be at a lower temperature than the return airflow (124). Consequently, when information handling systems obtain portions of the supply airflow (122), the information handling systems may be able to utilize the supply airflow (122) to cool components disposed within the chassis of the information handling systems. For example, gases from the supply airflow (122) may be passed by components disposed within chassis of information handling systems that are at elevated temperatures. The gases may be at a lower temperature than the components. Consequently, thermal exchange between the gases and the components may decrease the temperature of the components.

After utilizing the gases from the supply airflow (122), the information handling systems may exhaust the gases as the return airflow (124). After being exhausted from the information handling systems, the return airflow (124) may be obtained by the airflow conditioner (120), cooled (and/or humidity reduced), and recirculated as the supply airflow (122).

In addition to cooling the return airflow (124), the airflow conditioner (120) may be capable of obtaining gases from other areas (e.g., outside of the building), reducing the humidity level of an airflow, and/or otherwise conditioning gases for use by information handling systems and/or other devices.

To manage the aforementioned process, a system environmental manager (130) may be disposed within the building (115) or at other locations. The system environmental manager (130) may be a computing device programmed to (i) obtain information regarding the operation of the information handling systems and (ii) set the operating points of the airflow conditioner (120). By doing so, the system environmental manager (130) may cause the airflow conditioner (120) to provide gases to the information handling systems having a temperature and/or humidity level that may better enable the information handling systems to regulate their respective environmental conditions within the chassis of the respective information handling systems. However, conditioning the supply airflow (122) may utilize large amounts of energy.

The airflow conditioner (120) may include functionality to granularly, or at a macro level, modify the temperature and/or humidity level of the supply airflow (122). Consequently, different information handling systems (or groups thereof) may receive different supply airflows (e.g., 122) having different characteristics (e.g., different temperatures and/or humidity levels, different sources, etc.).

Conditioning the return airflow (124) or gases obtained from outside of the building (115) may be costly, consume large amounts of electricity, or may otherwise be undesirable. To reduce these costs, the system environmental manager (130) may set the operating point (e.g., desired temperature/humidity levels of different portions of the supply airflow (122)) of the airflow conditioner (120) to only provide the minimum necessary characteristics required by each of the IHSs so that it meets is service life goals. By doing so, the cost of providing the supply airflow (122) having characteristics required to meet the environmental requirements of the chassis of the information handling systems may be reduced.

To decide how to set the operating points of the airflow conditioner (120), the system environmental manager (130) may obtain and/or be provided information regarding the environmental conditions (e.g., temperatures, relative humidity levels, corrosion rates of components) within each of the chassis. For example, the system environmental manager (130) may be operably connected to environmental managers of each of the chassis and/or the airflow conditioner (120) via any combination of wired and/or wireless networks. The respective environmental managers of the chassis may provide such information to the system environmental manager (130) and/or service requests regarding the operating points of the airflow conditioner (120) via the operable connections.

The system environmental manager (130) may be implemented using a computing device. For additional details regarding computing devices, refer to FIG. 4.

FIG. 1.3 shows a diagram of a chassis (100A) in accordance with one or more embodiments of the invention. A chassis may be a portion of an IHS and/or house all, or a portion, of an IHS. An information handling system may include a computing device that provides any number of services (e.g., computing implemented services).

To provide services, the computing device may utilize computing resources provided by computing components (140.1, 140.2). The computing components (computing components A (140.1) and computing components B (140.2)) may include, for example, processors, memory modules, storage devices, special purpose hardware, and/or other types of physical components that contribute to the operation of the computing device. Additional description of a computing device may be found in the description of FIG. 4.

Because the computing device uses computing components (140.1, 140.2) to provide services, the ability of the computing device to provide services is limited based on the number and/or quantity of computing devices that may be disposed within the chassis. For example, by adding additional processors, memory modules, and/or special purpose hardware devices, the computing device may be provided with additional computing resources which it may be used to provide services. Consequently, large number of computing components that each, respectively, generate heat may be disposed within the chassis. Additional description of computing components may be found in the description of FIG. 1.4.

To maintain the temperatures of the computing components (140.1, 140.2) (and/or other types of components) within a nominal range, gases may be taken in through an air receiving exchange (142). The gases may be passed by the computing components (140.1, 140.2) to exchange heat with them. The heated gases may then be expelled out of an air expelling exchange (144).

However, by taking in and expelling gases used for cooling purposes, the air receiving exchange (142), other portions of the chassis (100A) and/or components disposed within the chassis (100A) may be subject to degradation due to corrosion. For example, as discussed above, the gases may include components such as humidity or chemical species that may chemically react forming corrosion. Importantly, the combination of humidity that may condense on components and chemically reactive species that may be absorbed into the condensed humidity may be particularly problematic.

The chemical reaction products may form corrosion, cause corrosion products to circulate in the chassis (and/or outside of the chassis by being expelled as part of heated gases), and/or damage the structure and/or change the electrical properties of the computing components (140.1, 140.2). These changes may negatively impact the ability of the computing device disposed in the chassis (100A) to provide its functionality.

For example, the computing device may have a service life during which it is expected that the computing device will be likely to provide its functionality. However, changes in the structure and/or electrical properties of these components due to exposure to humidity and/or chemically reactive specifies of the gases used for temperature regulation purposes may cause the components to prematurely fail ahead of the service life being met due to corrosion formation, change an appearance of the chassis by virtue of the presence of corrosion products, and/or otherwise negatively impact the chassis (100A) and/or components disposed within it.

In general, embodiments of the invention provide methods, devices, and systems for managing corrosion within chassis. To manage corrosion, a system in accordance with embodiments of the invention may: (i) modify corrosive materials to reduce their corrosiveness, (ii) reduce the quantity of corrosive materials (e.g., modifying the airflow), (iii) monitor the occurrence of corrosion (e.g., a corrosion state), and (iv) based on the monitored corrosion, activate one or more activate components to dehumidify, heat, redirect, and/or otherwise modify the internal environment of a chassis and/or information handling system to reduce the impact of the corrosion.

By doing so, embodiments of the invention may reduce the corrosion of chassis and/or components within chassis while limiting power consumption for gas conditioning purposes. Further, the computing devices disposed within chassis (e.g., 100A) may be more likely to meet their respective service life goals, have lower operation costs, and/or require fewer repairs during their respective service lives.

To manage the internal environment (104) of the chassis, the chassis (100A) may include a chassis environmental manager (150). The chassis environmental manager (150) may provide environmental management services. Environmental management services may include: (i) obtaining information regarding the rates of corrosion of the chassis and/or component(s) within the chassis, (ii) determining, based on the corrosion rates, whether service life goals are likely to be impacted by the corrosion, and/or (iii) modifying the operation (e.g., modifying operating points) of environmental control components (e.g., gas mover(s) (152), airflow disrupters (e.g., 177), nozzle plates (e.g., 179)) to reduce corrosion and/or reduce the amount of power consumed for environmental management purposes. For additional details regarding the chassis environmental manager (150), refer to FIG. 2.

While illustrated in FIG. 1.3 as a physical structure, as will be discussed with respect to FIG. 2, the chassis environmental manager (150) may be implemented as a logical entity (e.g., a program executing using the computing components (140.1, 140.2)). For example, a computing device disposed in the chassis (or other locations) may host an application (e.g., executable computer instructions being executed by a processor) that provides the functionality of the chassis environmental manager (150).

To enable the chassis environmental manager (150) to provide its functionality, the chassis (100A) may include one or more detectors (e.g., 154, 156). These detectors may enable the rates of corrosion of various components (e.g., portions of the chassis, computing components, etc.) to be determined and/or environmental conditions within and/or proximate to the chassis to be determined. These detectors may be implemented as sensors or other types of physical devices that are operably connected to the chassis environmental manager (150). Any number of corrosion detectors (e.g., 154), temperature detectors (e.g., 156), humidity detectors (e.g., 156), and/or other types of detectors may be disposed at any number of locations throughout the chassis (100A).

In some embodiments of the invention, the functionality of a temperature detector may be provided by, in all or in part, the computing components (140.1, 140.2). For example, the computing components (140.1, 140.2) may include functionality to report their respective temperatures and/or humidity levels of the internal environment (104) of the chassis (100A).

The chassis (100A) may also include environmental control components (e.g., gas mover(s) (152), airflow disrupter (177), nozzle plate (179)). The environmental control components may include physical devices that include functionality to modify characteristics (e.g., temperature, humidity level, airflow rates/directions) of the internal environment (104) of the chassis (100A). The chassis (100A) may include any number of environmental control components disposed at any number of locations within the chassis.

For example, the environmental control components may include gas movers such as fans, airflow disrupters (e.g., airflow disrupter (177)), and/or nozzle plates (e.g., nozzle plate (179)). The fans may be able to modify the rate of gases being taken into and expelled from the chassis (100A) through the air exchangers (e.g., 102.2, 102.4). The rate of intake and exhaust of gases may cause an airflow to be generated within the internal environment (104). The airflow may be used to modify the rate of thermal exchange between the computing components (140.1, 140.2) and the internal environment (104) (e.g., an environment proximate to the computing components (140.1, 140.2)).

As another example, the environmental control components may include an airflow disrupter. In one or more embodiments of the invention, an airflow disrupter (e.g., airflow disrupter (177)) is a structure that modifies the condensation formation propensity of an airflow. To do so, the airflow disrupter (177) may obstruct direct fluid flow (e.g., airflow (172)) into a volume (e.g., chassis (100A)) and/or to a particular component (e.g., computing components (140.1, 140.2)). Further, the airflow disrupter (177) may include a flat side oriented normal to the direction of the airflow (172). Consequently, airflow (172) flowing into the airflow disrupter (177) is forced to rapidly change direction and flow around the airflow disrupter (177) to continue traversing the chassis (100A). One of the benefits of using an airflow disrupter to reduce corrosion is that, by placing the airflow disrupter (177) upstream from sensitive components, the airflow disrupter (177) may encourage the airflow (172) to release water onto the airflow disrupter (177) (e.g., condensation (174) on the front-facing surface). Accordingly, the airflow disrupter (177) may partially dehumidify the airflow (172) thereby reducing the overall ability of the airflow (172) to cause corrosion on one or more sensitive component(s) of the chassis (100A) by reducing the condensation formation propensity of the airflow after the airflow interacts with the airflow disrupter (177). The airflow disrupter (177) may be strategically placed to ensure that the condensation on it does not disrupt the operation of other components disposed within the chassis (100A). Thus, an airflow disrupter (177) may be considered 'sacrificial' as the airflow disrupter (177) is intentionally exposed to higher levels of condensation (174) and/or corrosion than other components in the chassis (100A) while shielding corrosion sensitive components downstream from it from levels of humidity that would otherwise cause them to corrode at undesirable rates.

Further, by causing the gaseous matter of the airflow (172) to impact and move around the airflow disrupter (177), the airflow (172) may become turbulent (or more turbulent) from a laminar flow state when first entering the chassis (100A). Forcing the airflow (172) to be turbulent (or more turbulent) provides multiple advantages that reduce potential corrosion. Specifically, by inducing turbulent airflow (172), (i) the gaseous fluid provides greater heat and mass transfer (thereby allowing the airflow (172) to retain more water), and (ii) the boundary layer portion of the airflow's (172) velocity profile is reduced (thereby reducing the fluidic interactions that form condensation (174)). That is, as a fluid flows over a surface, the fluid closest and/or in direct contact with the surface moves at a comparatively lower speed than the majority of the fluid traversing the larger volume. Further, a 'velocity profile' of the fluid flow (i.e., a two-dimensional plot displaying fluid velocity as a function of distance to the boundary surface) indicates a distinct region (i.e., thickness of the fluid) in which the fluid's velocity is slowed due to the fluid's proximity to the surface. Within that slower moving region, the gaseous particles of the airflow (172) are provided greater ability to produce condensation on the surface. Further, there is a positive correlation between the height of the region of slower moving gases and the rate of condensation (and corrosion). Accordingly, if the boundary layer is reduced (e.g., by inducing turbulent airflow), the likelihood of condensation and corrosion are similarly reduced.

As another example, the environmental control components may include a nozzle plate. In one or more embodiments of the invention, a nozzle plate (e.g., nozzle plate (179)) is a structure that includes one or more through hole(s) (e.g., nozzles, slots, cutouts, openings, etc.) that narrows and focuses fluid flow onto an adjacent surface. As shown in FIG. 1.3, the through holes may be circular, in a grid, rectangular cutouts in horizontal and/or vertical orientation. One of ordinary skill in the art, having the benefit of this detailed description, would appreciate that the through holes may be any suitable shape.

In one or more embodiments of the invention, the nozzle plate (179), similar to the airflow disrupter (177), may include a flat side oriented normal to the direction of the airflow (172) that causes a portion of the airflow (172) to change direction to move around the nozzle plate (179) (and collect condensation). Consequently, the nozzle plate (179) may reduce the condensation formation propensity of the airflow with which it interacts. However, in one or more embodiments of the invention, the nozzle plate further includes one or more holes that allow fluid (e.g., airflow (172)) to flow directly through the structure and onto the downstream side of the nozzle plate (179). The holes are designed such that the fluid flowing through the holes increases in speed and impacts an adjacent surface (on the downstream side of the nozzle plate (179)) at a normal (i.e., perpendicular) direction. The adjacent surface may be a corrosion sensitive component that a user desires to have cooled via airflow (172) but not corrode via condensation (174).

In one or more embodiments of the invention, there is a negative correlation between fluid velocity and condensation (174) buildup (and corrosion). Thus, if the velocity of a fluid (e.g., airflow (172)) is increased over the surface of a component (e.g., computing components (140.1, 140.2)), corrosion will also be reduced. Further, corrosion occurs at a lower rate when the gas flows normal to the surface of the component (causing hotter turbulent flow) as compared to parallel gaseous flow over the surface of a component.

Further, in one or more embodiments of the invention, computing components (140.1, 140.2 may include a through hole that allows for the airflow (172) to pass between computing components (e.g., 140.2) when the computing components are placed normal to the airflow (172).

As an additional example, the environmental control components may include components that are not disposed in the chassis (not shown). For example, the environmental control components may include an airflow conditioner discussed with respect to FIG. 1.2. These external components may be used in conjunction with the environment control components disposed within the chassis to manage the temperature and/or relative humidity levels throughout the internal environment (104) of the chassis as well as those of gases as they are taken into and/or expelled by the chassis (100A).

The chassis (100A) may include any number and type of environmental control components without departing from the invention. Any of the environmental control components may be implemented using physical devices operably connected to and/or controllable by the chassis environmental manager (150) and/or a system environmental manager (e.g., 130, FIG. 1.2) (alone or in combination). Any number of chassis environmental managers and system environmental managers may cooperatively operate to control the temperature and/or relative humidity levels to control the rate of corrosion occurring within the chassis and/or manage the thermal load generated by the computing components (140.1, 140.2) and/or other components.

To cooperatively operate, the chassis environmental managers, the system environmental managers may be operably connected to each another (e.g., via wired and/or wireless networks). The aforementioned components may share information with one another (e.g., detector data, operating set points of different environmental control components, etc.). These components may implement any type of model for controlling and/or delegating control of the system for temperature, relative humidity level, and/or corrosion rate management purposes. Additionally, any capability and functionality described herein with respect to any specific environmental manager may be performed by any of the disclosed environmental managers (i.e., the chassis environmental managers and the system environmental managers). Any of these components may be implemented using a computing device. For additional details regarding computing devices, refer to FIG. 3.

While the chassis (100A) of FIG. 1.3 has been illustrated as including a limited number of specific components, a chassis in accordance with one or more embodiments of the invention may include additional, fewer, and/or different components without departing from the invention. For example, although computing components A (140.1) are shown oriented parallel to the direction of airflow (172) and not include a cutout (e.g., a through hole, hollow portion as shown on computing components B (140.2)), computing components A (140.1) may nonetheless be oriented such that the wider faces are perpendicular to the airflow (172) and/or may further include cutouts. Similarly, although computing components B (140.2) are shown oriented perpendicular to the airflow (172) and include cutouts, computing components B (140.2) may be oriented similar to computing components A (140.1) (parallel to the airflow (172)) and/or not include cutouts. Additionally, while the chassis (100A) is illustrated as having a specific form factor (e.g., rack mount), a chassis in accordance with embodiments of the invention may have different form factors without departing from the invention.

FIG. 1.4 shows a diagram of computing components (140) in accordance with one or more embodiments of the invention. The computing components (140) may enable computing devices to provide services, as discussed above. The computing components (140) may include any number of hardware devices (143). The hardware devices (143) may include, for example, packaged integrated circuits (e.g., chips). The hardware devices (143) may enable any number and type of functionalities to be performed by a computing device.

The computing components (140) may also include a circuit card (145). The circuit card (145) may enable any of the hardware devices (143) to be operably connected to one another and/or other components not illustrated in FIG. 1.4. For example, the circuit card (145 may be a multilayer printed circuit board (PCB) that includes circuitry.

The circuit card (145) may include traces (146) that electrically interconnect various hardware devices (143) to one another and/or other components not illustrated in FIG. 1.4 (e.g., via connectors not shown in FIG. 1.4 that enable the traces of the circuit card (145) to be connected to traces of other circuit cards). The traces (146) may be formed out of conductive materials, such as, copper thereby enabling electrical power to be provided to the hardware devices (143), electrical signals to be distributed among the hardware devices (143), etc.

Returning to the hardware devices (143), these devices may consume electrical power and generate heat as a byproduct of performing their functionality. Further, the hardware devices (143) may have some sensitivity to temperature. For example, the hardware devices (143) may only operate nominally (e.g., as designed) when the temperatures of the respective hardware devices (143) are maintained within a preferred temperature range. Consequently, all, or a portion, of the hardware devices (143) may require some level of cooling to continue to operate nominally.

As discussed above, to facilitate cooling of the hardware devices (143), airflows within the chassis may be generated by environmental control components such as fans, heaters, etc. The airflows may cause gases that are at different temperatures and/or relative humidity levels to be taken into the chassis, used for cooling purposes, and then expelled from the chassis.

However, this process may be problematic because the gases used for cooling purposes may also contribute to corrosion being formed on, for example, the traces (146), interconnections between the traces (146) and the hardware devices (143), etc. For example, when the traces (146) are exposed to gases that include humidity, the metals of the traces (146) may react with the gases thereby forming corrosion. More specifically, water vapor or other gases may condense forming a layer disposed on one or more surfaces of the traces and/or the hardware devices (143). The layer of condensed water may chemically interact with these components thereby forming corrosion.

The corrosion may, if kept to a low level, not impact the ability of the hardware devices (143) to perform their functionality over the course of the desired lifetime (e.g., service life) of a computing device. In contrast, if the rate of corrosion increases to a high enough level, the corrosion may negatively impact the ability of the hardware devices (143) to perform their respective functionalities to a level that causes the computing device to fail. Consequently, the computing device and corresponding IHS may fail prior to meeting its desired service life due to corrosion.

For example, if an IHS has a desired service life of five years, corrosion may cause one of the traces (146) to fail prior to five years of service thereby causing the IHS to prematurely fail.

Additionally, the rate of corrosion of these components may be proportional to the quantity of condensed water (i.e., condensation) on the surfaces of the components. For example, if a minimal amount of condensed water is disposed on the components, the rate of corrosion of the components may be very low. In contrast, if significant amount of condensed water a present, the rate of corrosion of the components may be high. A high rate of corrosion may cause the components to fail prior to them meeting their service life goals.

To reduce the impact of corrosion on the traces (146), hardware devices (143), and/or other components, an airflow disrupter and/or nozzle plate may be placed adjacent, parallel.

While the computing components (140) of FIG. 1.4 have been described and illustrated as including a limited number of specific components for the sake of brevity, an environmental manager in accordance with embodiments of the invention may include additional, fewer, and/or different components than those illustrated in FIG. 2 without departing from the invention.

FIG. 2 shows a diagram of an environmental manager (200) in accordance with one or more embodiments of the invention. The system environmental manager and/or chassis environmental manager illustrated in FIGS. 1.1, 1.2, and 1.3, respectively, may be similar to the environmental manager (200).

As discussed above, the environmental manager (200) may provide environmental management services. Environmental management services may reduce the likelihood that IHSs fail prematurely (e.g., prior to meeting service life goals) due to corrosion.

In one or more embodiments of the invention, the environmental manager (200) is implemented using computing devices. The computing devices may be, for example, mobile phones, tablet computers, laptop computers, desktop computers, servers, distributed computing systems, embedded computing devices, or a cloud resource. The computing devices may include one or more processors, memory (e.g., random access memory), and persistent storage (e.g., disk drives, solid state drives, etc.). The environmental manager (200) may be implemented using other types of computing devices without departing from the invention. For additional details regarding computing devices, refer to FIG. 3.

In one or more embodiments of the invention, the environmental manager (200) is implemented using distributed computing devices. As used herein, a distributed computing device refers to functionality provided by a logical device that utilizes the computing resources of one or more separate and/or distinct computing devices. For example, in one or more embodiments of the invention, the environmental manager (200) is implemented using distributed devices that include components distributed across any number of separate and/or distinct computing devices. In such a scenario, the functionality of the environmental manager (200) may be performed by multiple, different computing devices without departing from the invention.

To provide environmental management services, the environmental manager (200) may include an environmental component manager (202) and a storage (204). Each of these components is discussed below.

The environmental component manager (202) may manage environmental control components that may be used to control the characteristics (e.g., temperature, humidity level, airflow rates, quantities of corrosive materials included in gases used for thermal management purposes, etc.) of the environment within a chassis. To manage them, the environmental component manager (202) may (i) obtain information regarding the environmental conditions including temperatures, humidity levels, airflow rates, and/or corrosion rates, (ii) determine, using the environmental information, whether the IHS is likely to prematurely fail due to corrosion due to these conditions, (iii) if the IHS is likely to prematurely fail, modify the environmental conditions to reduce corrosion by modifying the operation of environmental control components, and/or (iv) if the IHS is unlikely to fail, modify the operation of environmental control components to reduce energy consumption used to condition gases for thermal management purposes (e.g., at the cost of potentially increased rates of corrosion).

To obtain information regarding the environmental conditions, the environmental component manager (202) may request such information from computing components (e.g., temperatures), detectors (e.g., corrosion, temperature, humidity, and/or other types of sensors), and/or other types of devices (e.g., components external to the chassis). In response, the aforementioned components may provide the requested information to the environmental component manager (202). The environmental component manager (202) may store the aforementioned information as part of an environmental condition repository (208).

To ascertain whether an IHS is likely to prematurely fail due to corrosion, the environmental component manager (202) may estimate a total amount of corrosion of different portions of a chassis and/or components disposed within a chassis that has likely occurred, estimate the rate that corrosion will occur in the future, and use the previous amount and current rate to determine whether environmental management components are able to continue to provide corrosion management services sufficient to meet the service life goals of the IHS.

To generate the estimates, the environmental component manager (202) may take into account the historical environmental conditions. For example, the environmental component manager (202) may use predictive models to estimate future corrosion of components based on historical rates of corrosion.

Utilizing these estimates, the environmental component manager (202) may determine whether the IHS is unlikely to meet its service life goal due to corrosion. To make this determination, the environmental component manager (202) may utilize a lifecycle repository (212). The lifecycle repository (212) may specify information that may be used to ascertain whether a premature failure will occur based on corrosion.

For example, the lifecycle repository (212) may specify a total amount of corrosion that will cause various components (e.g., computing components) to no longer be able to provide their respective functionalities. Based on these corrosion amounts and the corrosion estimates, the environmental component manager (202) may ascertain whether the any of these components will be unlikely to provide their functionalities prior to the IHS meeting its service life goals.

When providing its functionality, the environmental component manager (202) may utilize the storage (204) by storing and using previously stored data structures.

In one or more embodiments of the invention, the environmental component manager (202) is implemented using a hardware device including circuitry. The environmental component manager (202) may be implemented using, for example, a digital signal processor, a field programmable gate array, or an application specific integrated circuit. The environmental component manager (202) may be implemented using other types of hardware devices without departing from the invention.

In one or more embodiments of the invention, the environmental component manager (202) is implemented using computing code stored on a persistent storage that when executed by a processor performs all, or a portion, of the functionality of the environmental component manager (202). The processor may be a hardware processor including circuitry such as, for example, a central processing unit or a microcontroller. The processor may be other types of hardware devices for processing digital information without departing from the invention.

In one or more embodiments disclosed herein, the storage (204) is implemented using devices that provide data storage services (e.g., storing data and providing copies of previously stored data). The devices that provide data storage services may include hardware devices and/or logical devices. For example, storage (204) may include any quantity and/or combination of memory devices (i.e., volatile storage), long term storage devices (i.e., persistent storage), other types of hardware devices that may provide short term and/or long term data storage services, and/or logical storage devices (e.g., virtual persistent storage/virtual volatile storage).

For example, storage (204) may include a memory device (e.g., a dual in line memory device) in which data is stored and from which copies of previously stored data are provided. In another example, storage (204) may include a persistent storage device (e.g., a solid state disk drive) in which data is stored and from which copies of previously stored data are provided. In a still further example, storage (204) may include (i) a memory device (e.g., a dual in line memory device) in which data is stored and from which copies of previously stored data are provided and (ii) a persistent storage device that stores a copy of the data stored in the memory device (e.g., to provide a copy of the data in the event that power loss or other issues with the memory device that may impact its ability to maintain the copy of the data cause the memory device to lose the data).

The storage (204) may store data structures including an environmental condition repository (208), a corrosion rate repository (210), and a lifecycle repository (212). Each of these data structures is discussed below.

The environmental condition repository (208) may include one or more data structures that include information regarding the environmental conditions associated with a chassis and/or another type of component (e.g., a computing component). For example, when temperature, humidity, airflow rate, and/or corrosion data is read from a detector, the read information may be stored in the environmental condition repository (208). Consequently, a historical record of the environmental conditions associated with these components may be maintained.

The environmental condition repository (208) may include any type and quantity of information regarding the environmental conditions associated with these components. For example, the environmental condition repository (208) may include temperature sensor data from discrete temperature sensors and/or temperature sensors integrated into computing components (and/or other types of devices). In another example, the environmental condition repository (208) may include corrosion rates obtained from discrete or integrated corrosion detectors (e.g., on board a circuit card). In a still further example, the environmental condition repository (208) may include airflow rate data regarding the flow of gases within a chassis.

In addition to the data obtained using detectors, the environmental condition repository (208) may include spatial data regarding the relative locations of these components with respect to the locations of the detectors. For example, some of these components may be disposed away from the detectors. Consequently, it may not be possible to directly measure the temperature, relative humidity level, airflow rates, and/or corrosion of these components. The spatial data may be used to estimate, using measured temperatures and/or corrosion, the likely corrosion rates of these components.

The corrosion rate repository (210) may include one or more data structures that include information regarding the rates at which various components have corroded. For example, the corrosion rate repository (210) may include tables associated chassis, and/or other types of components disposed in chassis. Each of these tables may include the measured and/or estimated corrosion of these components.

The tables may also include the time at which the corrosion was measured. Consequently, the rates of corrosion of these components may be ascertained using the information included in the tables (e.g., corrosion at time T1−corrosion at time T2/the different between T1 and T2).

The lifecycle repository (212) may include one or more data structures that include information regarding the desired life of an information handling system. For example, the lifecycle repository (212) may specify how much corrosion may occur with respect to different components (e.g., portions of a chassis, computing components, etc.) before the respective components are likely to fail and/or the IHS is likely to fail due to downstream impacts of corrosion. The aforementioned information may be used in conjunction with determined corrosion rates and quantities of corrosion included in the corrosion rate repository (210) to determine whether it is likely that a component, computing device, and/or IHS is likely to fail prior to its desired service life.

While the data structures stored in storage (204) have been described as including a limited amount of specific information, any of the data structures stored in storage (204) may include additional, less, and/or different information without departing from the embodiments disclosed herein. Further, the aforementioned data structures may be combined, subdivided into any number of data structures, may be stored in other locations (e.g., in a storage hosted by another device), and/or spanned across any number of devices without departing from the embodiments disclosed herein. Any of these data structures may be implemented using, for example, lists, table, linked lists, databases, or any other type of data structures usable for storage of the aforementioned information.

While the environmental manager (200) of FIG. 2 has been described and illustrated as including a limited number of specific components for the sake of brevity, an environmental manager in accordance with embodiments of the invention may include additional, fewer, and/or different components than those illustrated in FIG. 2 without departing from the invention.

Further, any of the components may be implemented as a service spanning multiple devices. For example, multiple computing devices housed in multiple chassis may each run respective instances of the environmental component manager (202). Each of these instances may communicate and cooperate to provide the functionality of the environmental component manager (202).

Figure 3:
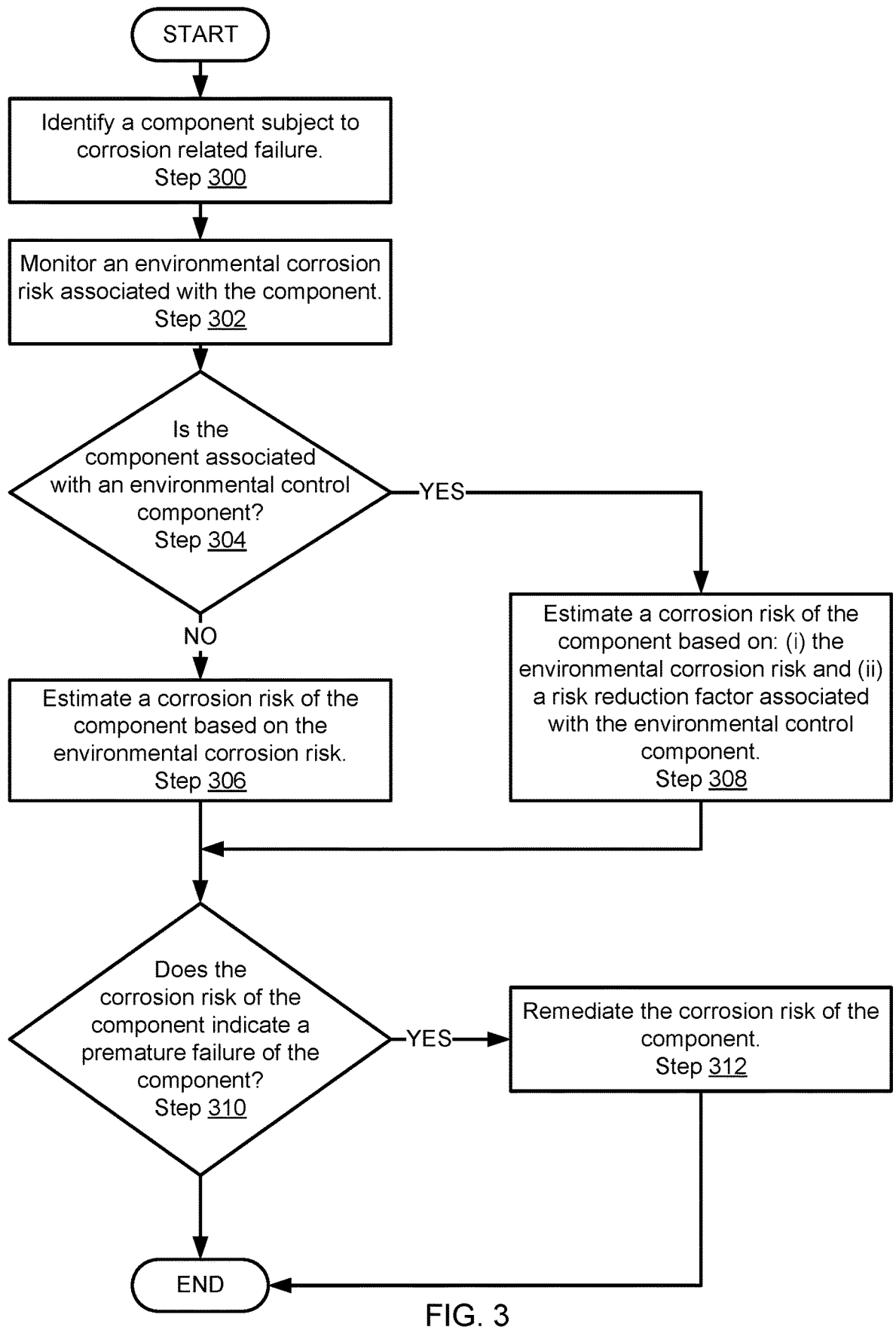
FIG. 3 shows a flowchart of a method of managing an internal environment of a chassis of an information handling system in accordance with one or more embodiments of the invention.

FIG. 3 shows a flowchart of a method in accordance with one or more embodiments of the invention. The method depicted in FIG. 3 may be used to manage the internal environment of a chassis in accordance with one or more embodiments of the invention. The method shown in FIG. 3 may be performed by, for example, an environmental manager (e.g., 200, FIG. 2). Other components of the system illustrated in FIGS. 1.1-2 may perform all, or a portion, of the method of FIG. 3 without departing from the invention.

While FIG. 3 is illustrated as a series of steps, any of the steps may be omitted, performed in a different order, additional steps may be included, and/or any or all of the steps may be performed in a parallel and/or partially overlapping manner without departing from the invention.

In step 300, a component subject to corrosion related failure is identified. The component may be identified using information included in a lifecycle repository. For example, the lifecycle repository may include a list of components that are subject to corrosion related failure. Any of these components included in the list may be the identified component.

In step 302, an environmental corrosion risk associated with the component is identified. The environmental corrosion risk may be identified based on detector measurements of the environment in which the component resides. For example, the temperature, relative humidity level, and/or other conditions that may impact corrosion may be monitored using detectors. These environmental conditions may be used as the environmental corrosion risk. Alternatively, the environmental corrosion risk may be measured using corrosion detectors that directly measure the rates of corrosion within the chassis due to the environment of the chassis.

In step 304, it is determined whether the component is associated with an environmental control component. The determination may be made based on information included in an environmental condition repository (208, FIG. 2). The environmental condition repository may specify each component that is associated with an environmental control component. The environmental condition repository may also specify correction factors that are associated with the environmental control component associated with the component.

If it is determined that the component is not associated with any environmental control components, the method may proceed to step 306. If it is determined that the component is associated with an environmental control component, the method may proceed to step 308.

In step 306, a corrosion risk of the component is estimated based on the environmental corrosion risk. For example, the environmental corrosion risk may be associated with corresponding levels of corrosion based on a composition of the component. The association may be determined in a laboratory environment and provided (e.g., stored in storage of or otherwise made available to) to an environmental manager.

For example, the corrosion risk of the component may be functionally related to the environmental corrosion risk. The corrosion risk of the component may be computed by providing the environmental corrosion risk as input to the functional relationship.

Returning to step 304, the method may proceed to step 308 following step 304 if it is determined that the component is associated with an environmental control component.

In step 308, a corrosion risk of the component is estimated based on (i) the environmental corrosion risk and (ii) a risk reduction factor associated with the environmental control component.

As discussed with respect to step 306, the corrosion risk of the component (e.g., how quickly the component is corroding) may be functionally related to the environmental corrosion risk. To take into account the presence of the environmental control component, a risk reduction factor (e.g., correction factor) may be applied to the output of the functional relationship to obtain the estimate of the corrosion risk of the component. In other words, the corrosion risk of the component based only on the environmental risk may be first calculated. Then, a risk reduction factor may be applied to obtain the corrosion risk of the component to reflect it being associated (e.g., in direct contact with) with an environmental control component.

The risk reduction factor may be based on, for example, the type, material composition, shape, method of integration of the environmental control component with the component, and/or characteristics of the component (e.g., shape, size, etc.). The risk reduction factor may be determined based on laboratory measurement and may be provided to the environmental manager prior to the performance of the method illustrated in FIG. 3.

For example, the risk reduction factor may be proportional to the rate of water removal from a surface of the component by the environmental control component. The size, shape, and/or other characteristics of the environmental control components may impact the rate of water removal, turbulent flow, and/or velocity of gaseous flow by the environmental control component. The rate of water removal and corresponding risk reduction factor may be determined in a laboratory environment prior to use of the environmental control component.

The method may proceed to step 310 follow step 306 and/or step 308.

In step 310, it is determined whether the corrosion risk of the component indicates a premature failure of the component. The determination may be made by using the corrosion risk of the component to determine whether the component is likely to prematurely fail before the service life of the component is met.

For example, it may be assumed that the rate of corrosion indicated by the corrosion risk of the component will remain constant and the duration of time between the current point in time and the future point in time at which failure is likely to occur may be determined. The future point in time may then be compared to the service life of the component to ascertain whether the rate of corrosion will result in a premature failure that occurs prior to the service life of the component being met. The service life of the component may be specified by a lifecycle repository.

The determination may be made by comparing the amount of corrosion of the component that has occurred and the corrosion rate to a maximum amount of corrosion that can occur before failure of the component is likely (e.g., specified in a lifecycle repository). In other words, solving the equation $C_f = C_c + T*C_r$ where $C_f$ is the amount of corrosion that can occur before premature failure is likely to occur, $C_c$ is the amount of corrosion that has already occurred, $C_r$ is the corrosion rate determined in steps 306 and/or 308, and T is the unknown amount of time until premature failure will occur due to corrosion. If the amount of time until premature failure indicates that failure of the component will occur before the desired service life of the component occurs, it is determined that the corrosion rates indicates a premature failure of the component will occur.

Additionally, predictive models may be used to further ascertain the likely point in time at which the component is likely to fail due to corrosion. For example, the rates of corrosion over time may be used as training data for a machine learning model, regressive function, or other type of model that may be used to predict the likely future rates of corrosion of the component. These models may then be used to predict the future corrosion of the component (rather than assuming a constant rate of corrosion). The previously measured and predicted future rates of corrosion (and/or absolute amounts of corrosion) may be utilized to determine when the component is likely to fail due to corrosion. Predicted date of failure may then be compared to the service life goal of the component to determine if it will prematurely fail (i.e., if the predicted failure date occurs prior to the service life goal).

If it is determined that the rate of corrosion indicates a premature failure of the component, the method may proceed to step 312. If it is determined that the rate of corrosion does not indicate premature failure of the component, the method may end following step 310.

In step 312, the corrosion risk of the component is remediated. The corrosion risk of the component may be remediated by modifying the environmental conditions within the chassis to reduce corrosion of the component.

For example, the airflow in the chassis may be modified via the use of an airflow disrupter to create turbulent flow, decrease humidity, increase the temperature of the air, and/or redirect the flow within the chassis. As another example, a nozzle plate may be used to reduce of the volume of airflow making contact with a corrosion-sensitive, while also increasing the speed of the remaining airflow via one or more holes (thereby further reducing potential for corrosion). Further, temperature of gases supplied to the chassis may be increased, the rate of gas flow through the chassis may be decreased, humidity may be removed from the gases supplied to the chassis, and/or other changes to the environment may be made. These changes may be made by modifying operating points of environmental control components.

To modify the operating points of the environmental control components, messages may be sent to the components indicating that changes are to be made, rates of power supplied to the components may be changed (e.g., reduced), and/or other modifications may be made.

The aforementioned changes may be made in a manner that minimizes the consumption of power for such purposes. In other words, reduction in that amount of corrosion due to these changes may be minimized such that the component is likely to meet its service life goal.

The method may end following step 312.

Using the method illustrated in FIG. 3, embodiments of the invention may provide a system that manages conditions within a chassis to limit corrosion to meet service life goals.

Figure 4:
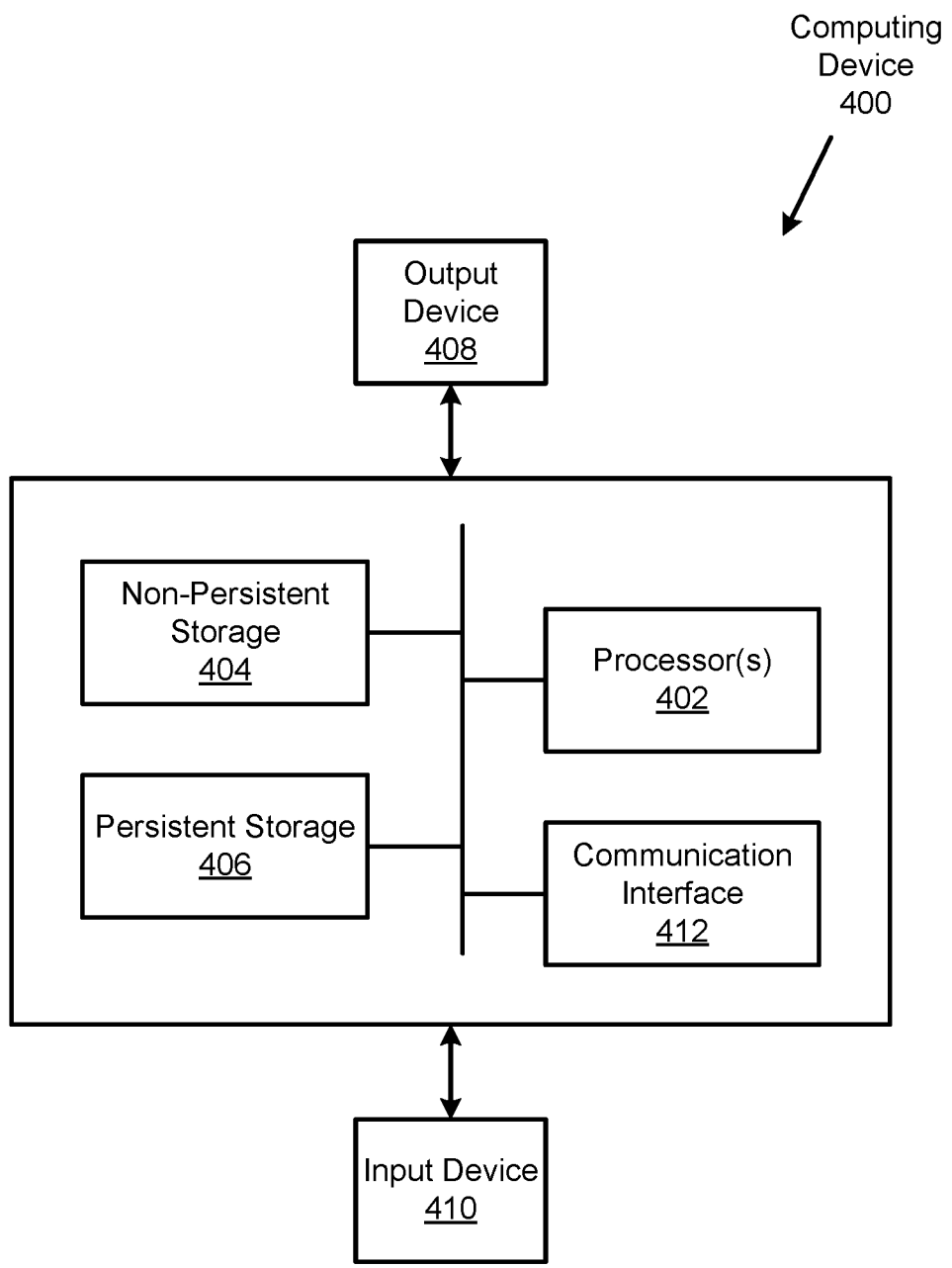
FIG. 4 shows a diagram of a computing device in accordance with one or more embodiments of the invention.

FIG. 4 shows a diagram of a computing device in accordance with one or more embodiments of the invention. Embodiments of the invention may be implemented using a computing device. The computing device (400) may include one or more computer processors (402), non-persistent storage (404) (e.g., volatile memory, such as random access memory (RAM), cache memory), persistent storage (406) (e.g., a hard disk, an optical drive such as a compact disk (CD) drive or digital versatile disk (DVD) drive, a flash memory, etc.), a communication interface (412) (e.g., Bluetooth interface, infrared interface, network interface, optical interface, etc.), input devices (410), output devices (408), and numerous other elements (not shown) and functionalities. Each of these components is described below.

In one embodiment of the invention, the computer processor(s) (402) may be an integrated circuit for processing instructions. For example, the computer processor(s) may be one or more cores or micro-cores of a processor. The computing device (400) may also include one or more input devices (410), such as a touchscreen, keyboard, mouse, microphone, touchpad, electronic pen, or any other type of input device. Further, the communication interface (412) may include an integrated circuit for connecting the computing device (400) to a network (not shown) (e.g., a local area network (LAN), a wide area network (WAN) such as the Internet, mobile network, or any other type of network) and/or to another device, such as another computing device.

In one embodiment of the invention, the computing device (400) may include one or more output devices (408), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (402), non-persistent storage (404), and persistent storage (406). Many different types of computing devices exist, and the aforementioned input and output device(s) may take other forms.

Embodiments of the invention may provide an improved method for managing components of an information handling system. Specifically, embodiments of the invention may provide a method and device for managing corrosion that may cause components of an information handling system to fail. To do so, embodiments of the invention may provide a system that reduces the condensation formation propensity of airflows used to thermally manage corrosion sensitive components. The system may do so using environmental control components including airflow disrupters and/or nozzle plates. The airflow disrupters and/or nozzle plates may reduce humidity of gases, increase the temperature of gases, and/or make gases turbulent to thermally. These modifications may reduce the condensation formation potential of the airflows used to thermally manage the computing components of the chassis. By doing so, corrosion of components thermally managed using the gases may be reduced by reducing the condensation formation potential of these airflows.

Thus, embodiments of the invention may address the problem of environments that may cause undesired corrosion. Specifically, embodiments of the invention may provide a method of managing corrosion that enables less power to be consumed for environmental conditioning purposes while still mitigating the impacts of corrosion by reducing the corrosion formation potential of airflows.

The problems discussed above should be understood as being examples of problems solved by embodiments of the invention disclosed herein and the invention should not be limited to solving the same/similar problems. The disclosed invention is broadly applicable to address a range of problems beyond those discussed herein.

One or more embodiments of the invention may be implemented using instructions executed by one or more processors of the data management device. Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. An information handling system, comprising:
   a computing component that is sensitive to corrosion; and
   a chassis in which the computing component is disposed, the chassis is adapted to:
      receive an airflow used to thermally manage the computing component, and
      expel the airflow after thermally managing the computing component;
   an environmental control component adapted to reduce a condensation formation propensity of a portion of the airflow that traverses the chassis proximate to the computing component;
   an environmental manager programmed to:
      monitor an environmental corrosion risk associated with the computing component, wherein the environmental corrosion risk is estimated based on a corrosion rate measured by a corrosion detector;
      make a determination that the computing component is associated with the environmental control component;
      in response to the determination:
         estimate a corrosion risk of the computing component based on:
            the environmental corrosion risk,
            a risk reduction factor associated with the environmental control component;
         make a second determination that the corrosion risk of the computing component indicates a premature failure of the computing component; and
         remediate, in response to the second determination, the corrosion risk of the computing component,
            wherein the risk reduction factor specifies a reduction in the corrosion rate of the computing component that is based on a rate of water vapor removal provided by the environmental control component.

2. The information handling system of claim 1, wherein the environmental control component is adapted to reduce the condensation formation propensity of the portion of the airflow by changing a direction of the portion of the airflow prior to traversing the chassis proximate to the computing component.

3. The information handling system of claim 1, wherein the environmental control component comprises:
   a flat surface oriented normal to the portion of the airflow.

4. The information handling system of claim 3, wherein the flat surface of the environmental control component impedes laminar flow of the airflow.

5. The information handling system of claim 1, wherein the environmental control component is adapted to reduce the condensation formation propensity of the portion of the airflow by increasing turbulence of the portion of the airflow prior to the airflow traversing the chassis proximate to the computing component.

6. The information handling system of claim 5, wherein the environmental control component comprises:
   a plurality of holes, wherein the portion of the airflow traverses the plurality of holes.

7. The information handling system of claim 6, wherein the portion of the airflow that traverses the plurality of holes flows in a direction normal to a surface of the computing component.

8. The information handling system of claim 6, wherein a depth of the plurality of holes is oriented normal to a surface of the computing components.

9. The information handling system of claim 1, wherein the environmental control component is adapted to reduce the condensation formation propensity of the portion of the airflow by condensing water vapor in the portion of the airflow prior to traversing the chassis proximate to the computing component.

10. The information handling system of claim 1, wherein remediating the corrosion risk of the computing component comprises:
    performing an action set comprising at least one selected from the group consisting of:
       increasing a temperature of the computing component; and
       decreasing a humidity level of an internal environment of the chassis proximate to the computing component.

11. The information handling system of claim 1, wherein the environmental manager is further programmed to:
    monitor a second environmental corrosion risk associated with a second component;

make a third determination that the second component is not associated with any environmental control components;

in response to the third determination:
estimate a second corrosion risk of the second component based on:
the second environmental corrosion risk, and
no risk reduction factors associated with any environmental control components;

make a fourth determination that the second corrosion risk of the second component indicates a second premature failure of the second component; and remediate, in response to the fourth determination, the second corrosion risk of the second component.

12. The information handling system of claim 1, wherein the environmental corrosion risk is estimated based on a temperature of the computing component and a relative humidity level of an internal environment of the chassis proximate to the computing component.

13. A method for environmentally managing an information handling system, comprising:
thermally managing a computing component that is sensitive to corrosion using an airflow received by a chassis that houses the computing component;
while thermally managing the computing component, reducing a condensation formation propensity of a portion of the airflow that traverses the chassis proximate to the computing component using an environmental control component,
wherein the environmental control component is a passive device;
monitoring an environmental corrosion risk associated with the computing component, wherein the environmental corrosion risk is estimated based on a corrosion rate measured by a corrosion detector;
making a determination that the computing component is associated with the environmental control component;
in response to the determination:
estimating a corrosion risk of the computing component based on:
the environmental corrosion risk, and
a risk reduction factor associated with the environmental control component;
making a second determination that the corrosion risk of the computing component indicates a premature failure of the computing component; and
remediating, in response to the second determination, the corrosion risk of the computing component,
wherein the risk reduction factor specifies a reduction in the corrosion rate of the computing component that is based on a rate of water vapor removal provided by the environmental control component.

14. The method of claim 13, wherein the environmental control component reduces the condensation formation propensity of the portion of the airflow by changing a direction of the portion of the airflow prior to traversing the chassis proximate to the computing component.

15. The method of claim 13, wherein the environmental control component reduces the condensation formation propensity of the portion of the airflow by increasing turbulence of the portion of the airflow prior to traversing the chassis proximate to the computing component.

16. A non-transitory computer readable medium comprising computer readable program code, which when executed by a computer processor enables the computer processor to perform a method for environmentally managing an information handling system, the method comprising:
thermally managing a computing component that is sensitive to corrosion using an airflow received by a chassis that houses the computing component;
while thermally managing the computing component, reducing a condensation formation propensity of a portion of the airflow that traverses the chassis proximate to the computing component using an environmental control component,
wherein the environmental control component is a passive device;
monitoring an environmental corrosion risk associated with the computing component, wherein the environmental corrosion risk is estimated based on a corrosion rate measured by a corrosion detector;
making a determination that the computing component is associated with the environmental control component;
in response to the determination:
estimating a corrosion risk of the computing component based on:
the environmental corrosion risk, and
a risk reduction factor associated with the environmental control component;
making a second determination that the corrosion risk of the computing component indicates a premature failure of the computing component; and
remediating, in response to the second determination, the corrosion risk of the computing component,
wherein the risk reduction factor specifies a reduction in the corrosion rate of the computing component that is based on a rate of water vapor removal provided by the environmental control component.

17. The non-transitory computer readable medium of claim 16, wherein the environmental control component reduces the condensation formation propensity of the portion of the airflow by increasing turbulence of the portion of the airflow as the portion of the airflow traverses the chassis proximate to the computing component.

* * * * *